(12) United States Patent
Kuramochi

(10) Patent No.: US 7,583,218 B2
(45) Date of Patent: Sep. 1, 2009

(54) COMPARATOR AND A-D CONVERTER

(75) Inventor: Yasuhide Kuramochi, Tokyo (JP)

(73) Assignee: Advantest Corporation, Tokyo (JP)

( * ) Notice: Subject to any disclaimer, the term of this patent is extended or adjusted under 35 U.S.C. 154(b) by 152 days.

(21) Appl. No.: 11/936,805

(22) Filed: Nov. 8, 2007

(65) Prior Publication Data
US 2009/0121911 A1    May 14, 2009

(51) Int. Cl.
*H03M 1/12* (2006.01)
(52) U.S. Cl. .................. 341/155; 341/164; 341/165; 341/166
(58) Field of Classification Search .............. 341/155, 341/164–166
See application file for complete search history.

(56) References Cited

U.S. PATENT DOCUMENTS

| | | | | |
|---|---|---|---|---|
| 4,237,387 A * | 12/1980 | Devendorf et al. | ........... | 327/223 |
| 5,382,916 A * | 1/1995 | King et al. | ................... | 330/253 |
| 6,198,420 B1 * | 3/2001 | Ryan et al. | ................... | 341/155 |
| 6,232,801 B1 * | 5/2001 | Khoury et al. | ................. | 327/57 |
| 6,369,743 B2 * | 4/2002 | Ono | ........................... | 341/159 |
| 6,420,932 B1 * | 7/2002 | Casper | ........................ | 330/258 |
| 6,831,586 B2 * | 12/2004 | Jansson | ....................... | 341/158 |
| 6,898,724 B2 * | 5/2005 | Chang | ........................ | 713/500 |
| 6,970,124 B1 * | 11/2005 | Patterson | ..................... | 341/155 |
| 7,193,554 B1 * | 3/2007 | Tadeparthy et al. | ........ | 341/200 |
| 7,299,028 B2 * | 11/2007 | Kim | ........................... | 455/318 |
| 2001/0007443 A1 * | 7/2001 | Ono | ........................... | 341/159 |
| 2003/0001767 A1 * | 1/2003 | Gendai | ....................... | 341/155 |

* cited by examiner

*Primary Examiner*—Linh V Nguyen
(74) *Attorney, Agent, or Firm*—Jianq Chyun IP Office

(57) ABSTRACT

A comparator is provided that outputs a comparison result obtained by comparing two signals. The comparator includes a positive buffer that converts a positive comparison signal, which has a level according to a difference between the two signals, into a positive logic signal that indicates a logic level; a negative buffer that converts a negative comparison signal, which has a level that is inverted in relation to the positive comparison signal, into a negative logic signal that indicates a logic level that is inverted in relation to the positive logic signal; a latch core that, at a timing at which a latch period in which the comparison result is held begins, acquires the logic level of the positive logic signal and the logic level of the negative logic signal and holds the acquired logic levels; and a potential control section that, prior to a timing at which the latch period ends, sets an output end of the positive buffer to have a potential that is identical to that of an output end of the negative buffer.

5 Claims, 7 Drawing Sheets

COMPARATOR AND A-D CONVERTER

BACKGROUND

1. Technical Field

The present invention relates to a comparator and an A-D converter. More particularly, the present invention relates to a comparator that outputs a comparison result obtained by comparing two signals and an A-D converter provided with the comparator.

2. Related Art

FIG. 1 shows a configuration of a comparator 300 provided with an A-D converter or the like. The comparator 300 includes a differential amplifier 310, a positive buffer 320, a negative buffer 330, and a latch core 340.

The differential amplifier 310 differentially amplifies a differential signal that represents a difference between two input voltages. The positive buffer 320 converts a positive output signal of the differential amplifier 310 into a logic level. The negative buffer 330 converts a negative output signal of the differential amplifier 310 into a logic level that is an inverse of the logic level of the positive buffer 320.

When in a latch condition, the latch core 340 holds the logic levels output from the positive buffer 320 and the negative buffer 330. Furthermore, when in a reset condition, the latch core 340 resets output ends of the positive buffer 320 and the negative buffer 330 to a prescribed logic level (for example, a positive logic level). Such a comparator 300 alternately transitions between the latch condition and the reset condition in sync with a sampling timing of the A-D converter.

During a time when such a comparator 300 transitions from the latch condition to the reset condition, kickback noise that returns to the differential amplifier 300 from the positive buffer 320 and the negative buffer 330 is generated. The following is a simple description of the reason that kickback noise is generated.

Because the positive buffer 320 and the negative buffer 330 include transistors at an input side, the positive buffer 320 and the negative buffer 330 have a parasitic capacitance that relies on a bias voltage. Because the positive buffer 320 and the negative buffer 330 output logic levels that are inverses of each other while in the latch condition, bias voltages that are different from each other are applied to the transistors at the input side. Accordingly, while in the latch condition, the positive buffer 320 and the negative buffer 330 have parasitic capacitances that are different from each other as seen from a side of the differential amplifier 310.

Because the positive buffer 320 and the negative buffer 330 are reset to have logic levels identical to each other while in the reset condition, bias voltages that are identical to each other are applied to the transistors at the input side. Accordingly, while in the reset condition, the positive buffer 320 and the negative buffer 330 have parasitic capacitances that are identical to each other as seen from a side of the differential amplifier 310. Because of this, fluctuation amounts of the parasitic capacitances of the positive buffer 320 and the negative buffer 330 are different during transition from the latch condition to the reset condition.

Here, where the parasitic capacitances of the transistors at the input side fluctuate, the positive buffer 320 and the negative buffer 330 emit charges to the differential amplifier 310 according to the fluctuation amounts of the parasitic capacitances. Because the fluctuation amounts of the parasitic capacitances are different during transition from the latch condition to the reset condition, the amounts of charge emitted by the positive buffer 320 and the negative buffer 330 are different. Accordingly, during transition from the latch condition to the reset condition, the positive buffer 320 and the negative buffer 330 supply differential mode noise (kickback noise) to the differential amplifier 310.

In the manner described above, the comparator 300 generates kickback noise. Accordingly, the comparator 300 must transition to the next latch condition after the kickback noise has sufficiently decreased since transitioning to the reset condition.

In a case where the sampling rate of the A-D converter is increased, the comparator 300 must operate at a high speed. However, where the comparator 300 operates at a high speed, the comparator 300 must transition to the next latch condition before the kickback noise is sufficiently reduced. In such a case, it is possible that a mistaken value caused by the effect of the kickback noise is acquired in the latch core 340 by the comparator 300.

SUMMARY

According to a first embodiment of the present invention, a comparator that outputs a comparison result obtained by comparing two signals is provided. The comparator includes a positive buffer that converts a positive comparison signal, which has a level according to a difference between the two signals, into a positive logic signal that indicates a logic level; a negative buffer that converts a negative comparison signal, which has a level that is inverted in relation to the positive comparison signal, into a negative logic signal that indicates a logic level that is inverted in relation to the positive logic signal; a latch core that, at a timing at which a latch period in which the comparison result is held begins, acquires the logic level of the positive logic signal and the logic level of the negative logic signal and holds the acquired logic levels; and a potential control section that, prior to a timing at which the latch period ends, sets an output end of the positive buffer to have a potential that is identical to that of an output end of the negative buffer.

According to a second aspect of the present invention, an A-D converter that outputs digital output data according to an analog input signal is provided. The A-D converter includes a comparator that outputs a comparison result obtained by comparing the input signal to a comparison signal that indicates a threshold value for quantizing an analog value into a digital value and a data determining section that determines the output data based on the comparison result of the comparator. In the A-D converter, the comparator includes a positive buffer that converts a positive comparison signal, which has a level according to a difference between the comparison signal and the input signal, into a positive logic signal that indicates a logic level; a negative buffer that converts a negative comparison signal, which has a level that is inverted in relation to the positive comparison signal, into a negative logic signal that indicates a logic level that is inverted in relation to the positive logic signal; a latch core that, at a timing at which a latch period in which the comparison result is held begins, acquires the logic level of the positive logic signal and the logic level of the negative logic signal and holds the acquired logic levels; and a potential control section that, prior to a timing at which the latch period ends, sets an output end of the positive buffer to have a potential that is identical to that of an output end of the negative buffer.

The summary clause does not necessarily describe all necessary features of the embodiments of the present invention. The present invention may also be a sub-combination of the features described above.

BRIEF DESCRIPTION OF THE DRAWINGS

FIG. 1 shows a configuration of a comparator 300 provided with an A-D converter or the like.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
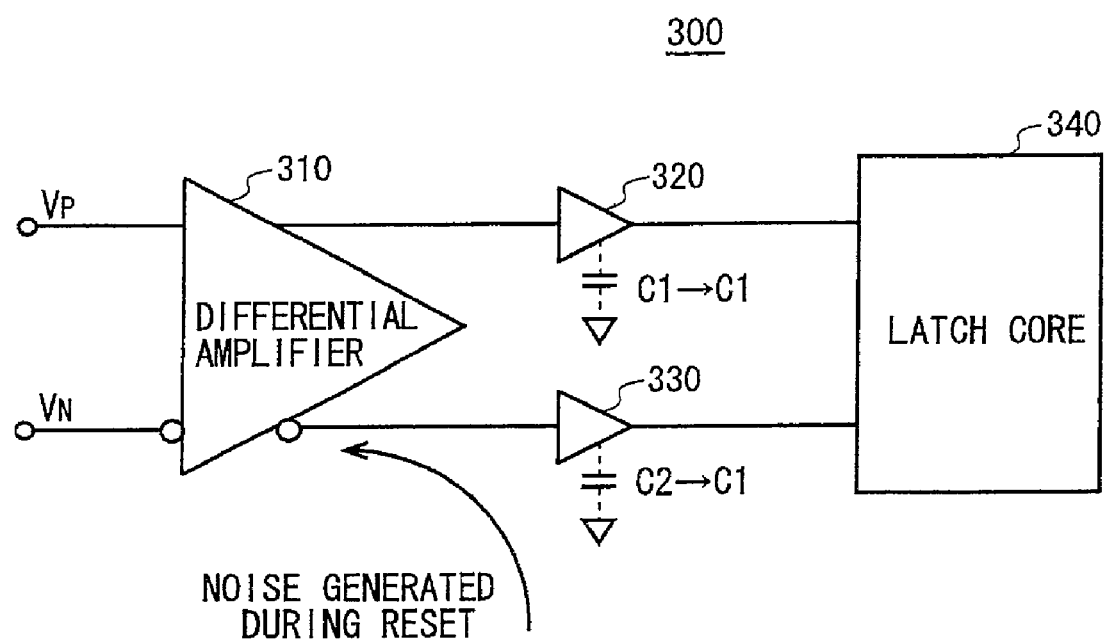
Figure 2:
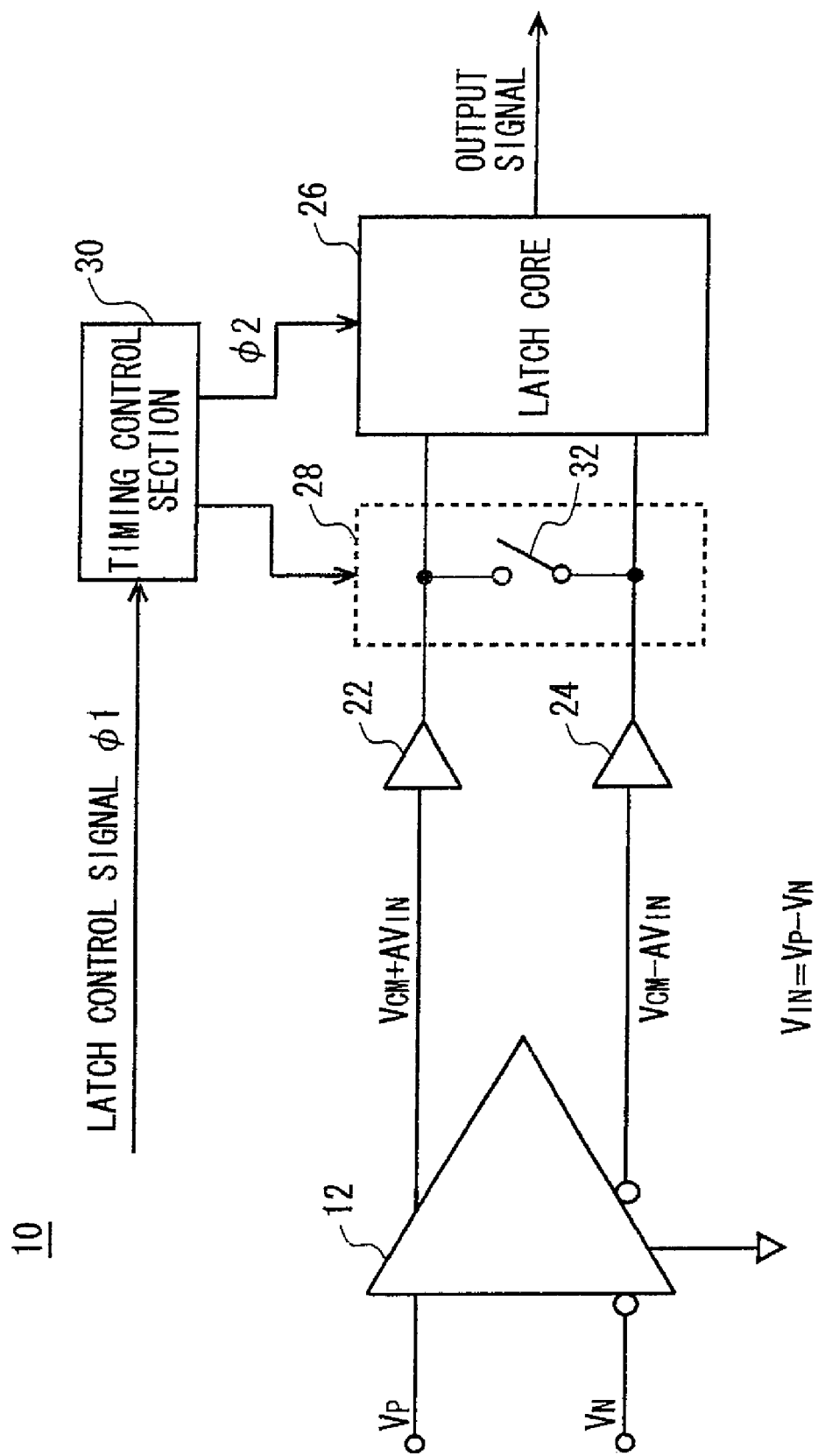
FIG. 2 shows a configuration of a comparator 10 according to the present embodiment.

FIG. 2 shows a configuration of a comparator 10 according to the present embodiment. The comparator 10 outputs a comparison result obtained by comparing two signals (a positive input signal $V_P$ and a negative input signal $V_N$). More specifically, the comparator 10 outputs a logic value that indicates which is larger between the positive input signal $V_P$ and the negative input signal $V_N$.

Furthermore, the comparator 10, in sync with a latch control signal φ1 supplied from an external section, alternately repeats a latch condition in which the comparison result is acquired and held and a reset condition in which the comparison result is reset. At a time when the latch period setting the latch condition begins, the comparator 10 acquires the logic value that indicates the comparison result obtained by comparing the positive input signal $V_P$ and the negative input signal $V_N$. The comparator 10 then holds the acquired logic value during the latch period.

Furthermore, at a time when the reset period setting the reset condition begins, the comparator 10 acquires a prescribed logic value (for example, logic H or logic L) and resets the logic value being held therein. The comparator 10 then holds the prescribed logic value during the reset period.

The comparator 10 is provided with a differential amplifier 12, a positive buffer 22, a negative buffer 24, a latch core 26, a potential control section 28, and a timing control section 30.

The differential amplifier 12 receives the two signals (the positive input signal $V_P$ and the negative input signal $V_N$) that are the comparison targets. The differential amplifier 12 outputs from a positive output terminal thereof a positive comparison signal ($V_{CM}+V_{IN}$) having a level according to a difference between the positive input signal $V_P$ and the negative input signal $V_N$ ($V_{IN}=V_P-V_N$). Furthermore, the differential amplifier 12 outputs from a negative output terminal thereof a negative comparison signal ($V_{CM}-V_{IN}$) having a level obtained by inverting a positive-negative property of the positive comparison signal ($V_{CM}+V_{IN}$) with a common voltage ($V_{CM}$) as a center. In the present embodiment, the comparator 10 outputs a negative comparison signal ($V_{CM}-AV_{IN}$) and a positive comparison signal ($V_{CM}+AV_{IN}$) obtained by differentially amplifying a difference between the positive input signal $V_P$ and the negative input signal $V_N$.

The positive buffer 22 receives the positive comparison signal ($V_{CM}+AV_{IN}$) from the positive output terminal of the differential amplifier 12. The positive buffer 22 converts the positive comparison signal into a positive logic signal that indicates a logic level.

The negative buffer 24 receives the negative comparison signal ($V_{CM}-AV_{IN}$) from the negative output terminal of the differential amplifier 12. The positive buffer 22 converts the negative comparison signal into a negative logic signal that indicates a logic level that is inverted in relation to the positive logic signal. The positive buffer 22 and the negative buffer 24 may be transistors having a grounded emitter, FETs having a grounded source, or the like. Furthermore, the positive buffer 22 and the negative buffer 24 may be emitter follower circuits or source follower circuits, for example.

The latch core 26, at a time when the latch period begins, acquires the logic level of the positive logic signal output from the positive buffer 22 and the logic level of the negative logic signal output from the negative buffer 24. The latch core 26 then holds the acquired logic level of the positive logic signal and the logic level of the negative logic signal during the latch period.

The latch core 26, at a time when the reset period begins, resets both the logic level of the positive logic signal and the logic level of the negative logic signal being held therein to logic levels that indicate prescribed logic values. The latch core 26 then holds the logic levels that indicate the prescribed logic values during the reset period. The latch core 26 described above outputs the logic levels being held to an external section as an output signal that indicates a comparison result obtained by comparing the positive input signal $V_P$ to the negative input signal $V_N$.

The potential control section 28, prior to a time at which the latch period ends, sets the output end of the negative buffer 24 and the output end of the positive buffer 22 to have the same potential. For example, the potential control section 28 may include a switch 32. The switch 32, prior to a time at which the latch period ends, provides conduction between the output end of the negative buffer 24 and the output end of the positive buffer 22. In addition to such a function or instead of such a function, the switch 32, prior to a time at which the latch period ends, may provide conduction between the input end of the negative buffer 24 and the input end of the positive buffer 22.

The potential control section 28 described above, prior to a time at which the latch period ends, can cause the parasitic capacitance of the positive buffer 22 and the parasitic capacitance of the negative buffer 24 to be the same as seen from a side of the differential amplifier 12. Here, where the parasitic capacitances of the positive buffer 22 and the negative buffer 24 fluctuate, a charge according to the fluctuation amount of the parasitic capacitance is emitted to the differential amplifier 12 in front of the positive buffer 22 and the negative buffer 24. However, if both output ends are set to the same potential, the differential mode noise is not supplied to the differential amplifier at a time of transition from the latch condition to the reset condition because the positive buffer 22 and the negative buffer 24 emit charge amounts that are identical to each another.

The timing control section 30 receives the latch control signal φ1 supplied from an outside section and controls operations of the latch core 26 and the potential control section 28. The timing control section 30 generates a signal that controls the reset timing of the latch core 26 and the timing at which the latch core 26 acquires the signal levels based on the latch control signal φ1. Furthermore, prior to the resetting of the latch core 26, the timing control section 30 generates a signal that provides conduction between the output end of the positive buffer 22 and the output end of the negative buffer 24. Yet further, prior to a time at which the signal levels are acquired by the latch core 26, the timing control section 30 generates a signal that causes the output end of the positive buffer 22 and the output end of the negative buffer 24 to be opened.

Figure 3:
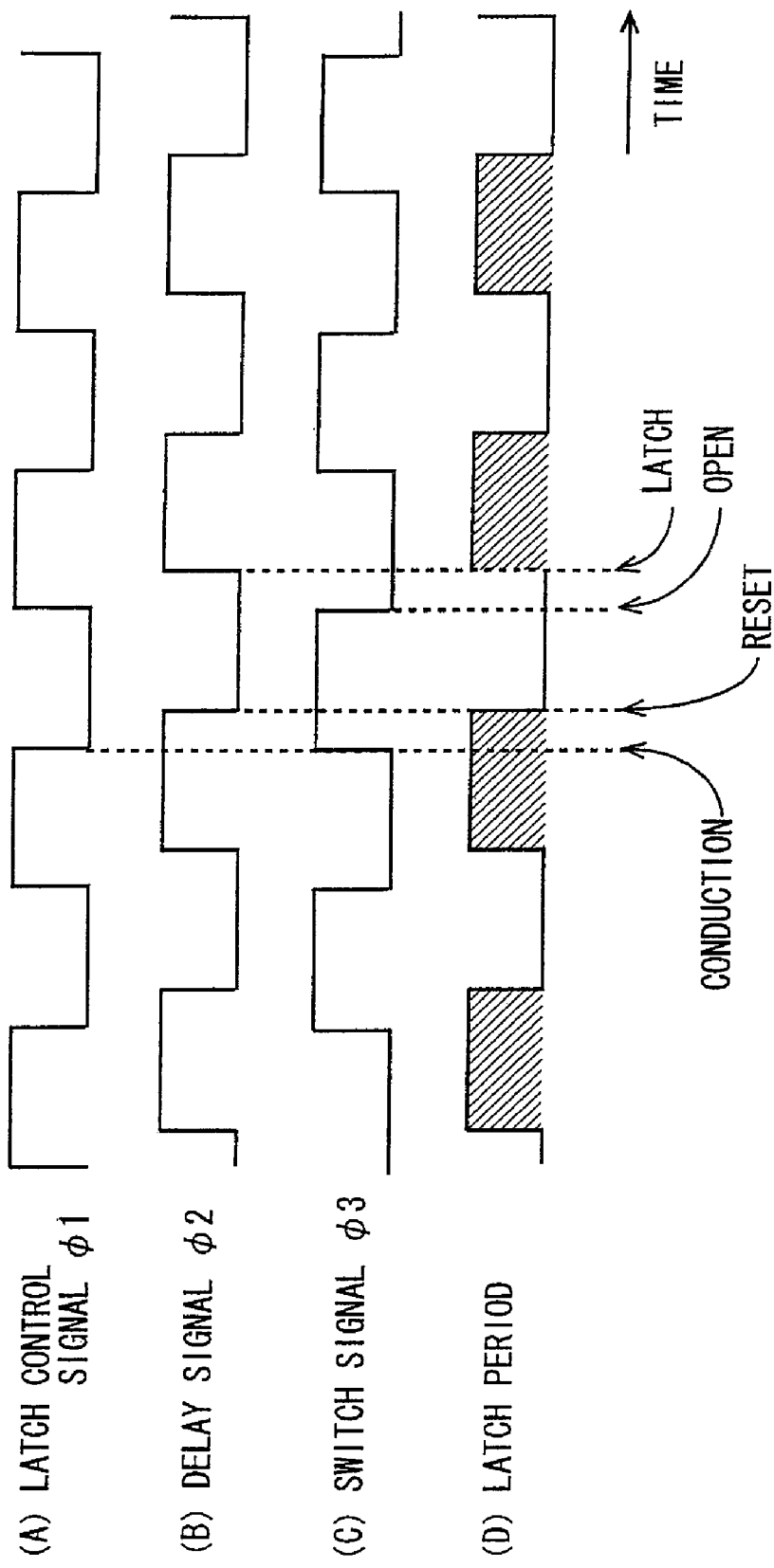
FIG. 3 shows an example of the latch control signal φ1, the delay signal φ2, the switch signal φ3, and the latch period.

FIG. 3 shows an example of the latch control signal φ1, the delay signal φ2, the switch signal φ3, and the latch period. The timing control section 30 receives the latch control signal φ1, such as that shown in FIG. 3(A), for example, having a prescribed period (for example, a sampling period of the A-D converter).

The timing control section 30 generates a delay signal φ2, such as that shown in FIG. 3(B), for example, which is obtained by delaying the latch control signal φ1 by an amount of time sufficiently shorter than the period of the latch control signal 1. The timing control section 30 supplies the generated delay signal φ2 to the latch core 26 to control the timing of the condition transition of the latch core 26. For example, the latch core 26 may be in the latch condition during a period in which the delay signal φ2 is logic H and in a reset condition during a period in which the delay signal φ2 is logic L.

Furthermore, the timing control section 30 generates a switch signal φ3 (in the present embodiment, such a signal has logic that is the inverse of that of the latch control signal φ1), such as that shown in FIG. 3(C), for example, which has a phase identical to that of the latch control signal φ1. The timing control section 30 supplies the generated switch signal φ3 to the switch 32 to control the timing of the conduction and opening of the switch 32. For example, the switch 32 may provide conduction (a short circuit between the output end of the positive buffer 22 and the output end of the negative buffer 24) during a period in which the switch signal φ3 is logic H and be open during a period in which the switch signal φ3 is logic L.

Therefore, as shown in FIG. 4(D), the latch core 26 transitions from the latch condition to the reset condition after a very small amount of time (an amount of time sufficiently shorter than one period of the latch control signal φ1) passes from the time at which conduction is provided between the output end of the positive buffer 22 and the output end of the negative buffer 24. Furthermore, the latch core 26 transitions from the reset condition to the latch condition after a very small amount of time passes from the time at which the output end of the positive buffer 22 and the output end of the negative buffer 24 are opened.

Through the comparator 10 described above, kickback noise that returns to the differential amplifier 12 from the positive buffer 22 and the negative buffer 24 during the transition from the latch condition to the reset condition can be reduced. Therefore, through the comparator 10, logic values can be accurately acquired, even in a case of high-speed operation.

Figure 4:
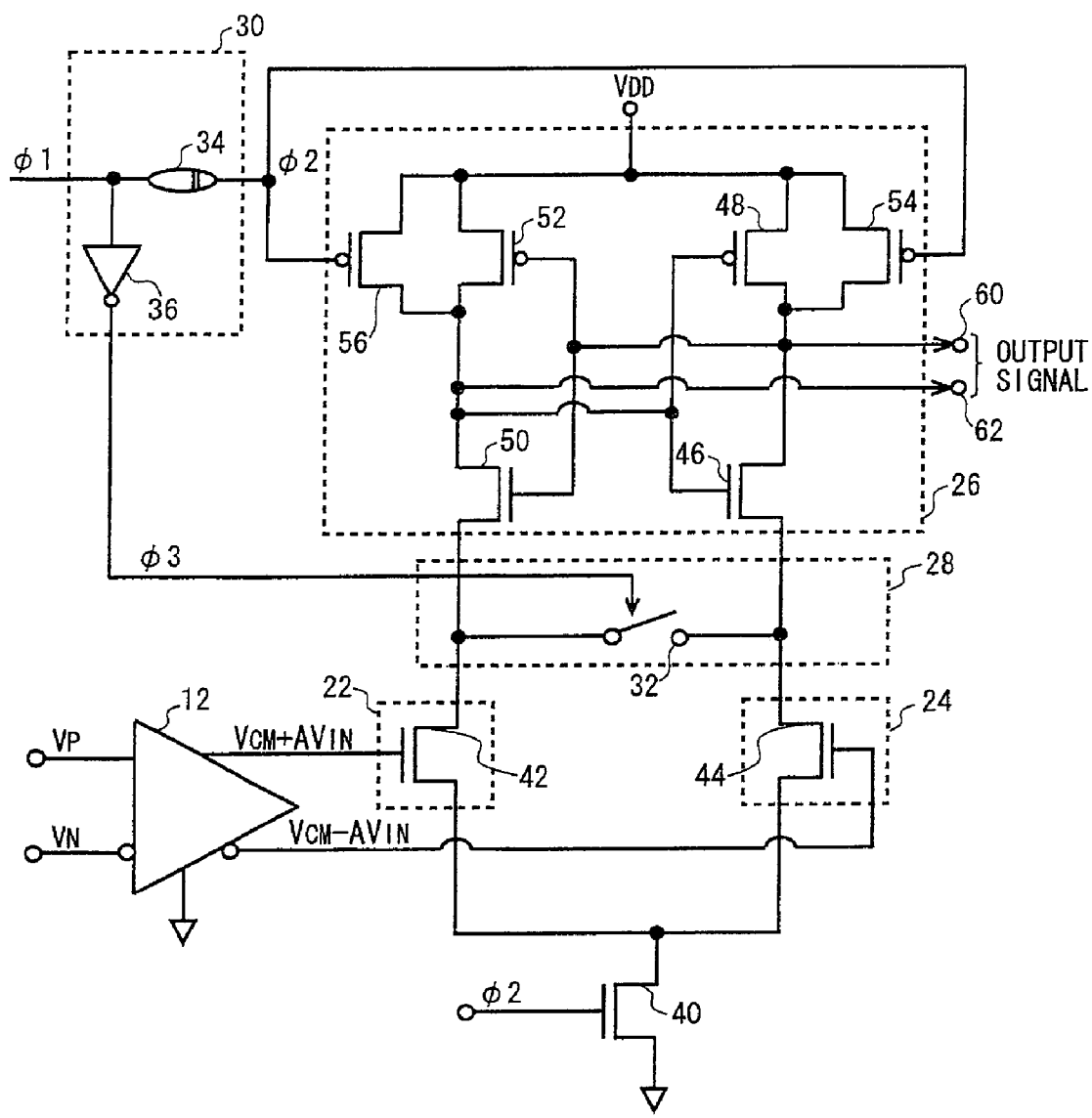
FIG. 4 shows a structure of the comparator 10 according to a modification of the present embodiment.

FIG. 4 shows a structure of the comparator 10 according to a modification of the present embodiment. The comparator 10 according to the present modification adopts a configuration and function substantially identical to those of the comparator 10 shown in FIG. 2, and therefore the same reference numerals are given to parts having the substantially same configuration and function as parts shown in FIG. 2 and the following description omits identical points.

The timing control section 30 according to the present modification includes a delay element 34 and an inverting circuit 36. The delay element 34 outputs the delay signal φ2 obtained by delaying the latch control signal φ1 by a very small amount of time. The inverting circuit 36 outputs the switch signal φ3 obtained by inverting the latch control signal φ1. The timing control section 30 described above can generate the delay signal φ2 and the switch signal φ3 based on the latch control signal φ1.

Furthermore, in the present modification, the comparator 10 is further provided with a reset n-MOSFET 40. The positive buffer 22 includes an n-MOSFET 42 therein. The negative buffer 24 includes an n-MOSFET 44 therein. The latch core 26 includes a positive n-MOSFET 46, a positive p-MOSFET 48, a negative n-MOSFET 50, a negative p-MOSFET 52, a positive reset p-MOSFET 54, and a negative reset p-MOSFET 56.

The delay signal φ2 is provided to the gate of the reset n-MOSFET 40. The source of the reset n-MOSFET 40 is connected to a ground potential (logic L level). The drain of the reset n-MOSFET 40 is connected to the source of the n-MOSFET 42 inside the positive buffer and the source of the n-MOSFET 44 inside the negative buffer. The reset n-MOSFET 40 described above is turned on when the delay signal φ2 is logic H (the latch period) and is turned off when the delay signal φ2 is logic L (the reset period).

The positive comparison signal ($V_{CM}+AV_{IN}$) output from the positive output terminal of the differential amplifier 12 is supplied to the gate of the n-MOSFET 42 inside the positive buffer. The negative comparison signal ($V_{CM}-AV_{IN}$) output from the negative output terminal of the differential amplifier 12 is supplied to the gate of the n-MOSFET 44 inside the negative buffer.

The gate of the positive n-MOSFET 46 and the gate of the positive p-MOSFET 48 are commonly connected. The drain of the positive n-MOSFET 46 and the drain of the positive p-MOSFET 48 are commonly connected. The source of the positive n-MOSFET 46 is connected to the drain of the n-MOSFET 44 inside the negative buffer. The source of the positive p-MOSFET 48 is connected to a power supply potential (logic H level). Because the gates and drains of the positive n-MOSFET 46 and the positive p-MOSFET 48 described above are commonly connected, one of either the positive n-MOSFET 46 or the positive p-MOSFET 48 is off in a case where the other is on.

The gate of the negative n-MOSFET 50 and the gate of the negative p-MOSFET 52 are commonly connected. The drain of the negative n-MOSFET 50 and the drain of the negative p-MOSFET 52 are commonly connected. The source of the negative n-MOSFET 50 is connected to the drain of the n-MOSFET 42 inside the positive buffer. The source of the negative p-MOSFET 52 is connected to a power supply potential (logic H level). Because the gates and drains of the negative n-MOSFET 50 and the negative p-MOSFET 52 described above are commonly connected, one of either the negative n-MOSFET 50 or the negative p-MOSFET 52 is off in a case where the other is on.

The drains of the positive n-MOSFET 46 and the positive p-MOSFET 48 are connected to the positive output terminal 60. The drains of the negative n-MOSFET 50 and the negative p-MOSFET 52 are connected to the negative output terminal 62.

In addition, the gates of the positive n-MOSFET 46 and the positive p-MOSFET 48 are connected to the drains of the negative n-MOSFET 50 and the negative p-MOSFET 52. Furthermore, the gates of the negative n-MOSFET 50 and the negative p-MOSFET 52 are connected to the drains of the positive n-MOSFET 46 and the positive p-MOSFET 48.

Accordingly, in a case where the positive n-MOSFET 46 is on and the positive p-MOSFET 48 is off, the negative n-MOSFET 50 is turned off and the negative p-MOSFET 52 is turned on. Furthermore, in a case where the positive n-MOSFET 46 is off and the positive p-MOSFET 48 is on, the negative n-MOSFET 50 is turned on and the negative p-MOSFET 52 is turned off. Therefore, in a case where the positive output terminal 60 is the power supply potential (logic H level), the negative output terminal 62 becomes the ground potential (logic L level), and in a case where the negative output terminal 62 is the ground potential (logic L level), the positive output terminal 60 becomes the power supply potential (logic H level), thereby performing a switching operation in which the positive output terminal 60 and the negative output terminal 62 are caused to be inverses of each other.

The delay signal $\phi 2$ is supplied to the gate of the positive reset p-MOSFET 54. The drain of the positive reset p-MOSFET 54 is connected to the positive output terminal 60. The source of the positive reset p-MOSFET 54 is connected to the power supply potential (logic H level). The positive reset p-MOSFET 54 described above is turned off when the delay signal $\phi 2$ is logic H (the latch period) and is turned on when the delay signal $\phi 2$ is logic L (the reset period).

The delay signal $\phi 2$ is supplied to the gate of the negative reset p-MOSFET 56. The drain of the negative reset p-MOSFET 56 is connected to the negative output terminal 62. The source of the negative reset p-MOSFET 56 is connected to the power supply potential (logic H level). The negative reset p-MOSFET 56 described above is turned off when the delay signal $\phi 2$ is logic H (the latch period) and is turned on when the delay signal $\phi 2$ is logic L (the reset period).

In the present modification, the switch 32 receives the switch signal $\phi 3$ and provides a short circuit or opens between the drain of the n-MOSFET 42 inside the positive buffer and the drain of the n-MOSFET 44 inside the negative buffer. In a case where the switch signal $\phi 3$ is logic H, the switch 32 provides a short circuit between the drain of the n-MOSFET 42 inside the positive buffer and the drain of the n-MOSFET 44 inside the negative buffer. Furthermore, in a case where the switch signal $\phi 3$ is logic L, the switch 32 opens between the drain of the n-MOSFET 42 inside the positive buffer and the drain of the n-MOSFET 44 inside the negative buffer.

In the comparator 10 described above, the reset n-MOSFET 40 is turned off and the positive reset p-MOSFET 54 and the negative reset p-MOSFET 56 are turned on in the reset period. Therefore, in the reset period, the comparator 10 can output the prescribed logic level (logic H level) from the positive output terminal 60 and the negative output terminal 62.

Furthermore, in the comparator 10 described above, the reset n-MOSFET 40 is turned on and the positive reset p-MOSFET 54 and the negative reset p-MOSFET 56 are turned off in the latch period. Accordingly, in a case where the positive comparison signal $(V_{CM}+AV_{IN})$ is greater than the negative comparison signal $(V_{CM}-AV_{IN})$ at a time when the latch period begins, the potential of the drain of the n-MOSFET 42 inside the positive buffer becomes low and the potential of the drain of the n-MOSFET 44 inside the negative buffer becomes high. Therefore, the positive n-MOSFET 46 is turned off, the positive p-MOSFET 48 is turned on, the negative n-MOSFET 50 is turned on, and the negative p-MOSFET 52 is turned off, which results in the positive output terminal 60 becoming logic H level and the negative output terminal 62 becoming logic L level.

Furthermore, in a case where the positive comparison signal $(V_{CM}+AV_{IN})$ is less than negative comparison signal $(V_{CM}-AV_{IN})$ at a time when the latch period begins, the potential of the drain of the n-MOSFET 42 inside the positive buffer becomes high and the potential of the drain of the n-MOSFET 44 inside the negative buffer becomes low. Therefore, the positive n-MOSFET 46 is turned on, the positive p-MOSFET 48 is turned off, the negative n-MOSFET 50 is turned off, and the negative p-MOSFET 52 is turned on, which results in the positive output terminal 60 becoming logic L level and the negative output terminal 62 becoming logic H level.

In addition, in the present modification, prior to transitioning from the latch condition to the reset condition, the switch 32 provides a short circuit between the drain of the n-MOSFET 42 inside the positive buffer and the drain of the n-MOSFET 44 inside the negative buffer, causing the potentials thereof to be the same. Therefore, at a time of transition from the latch condition to the reset condition, the switch 32 can cause the charge amounts returning to the positive output terminal and the negative output terminal of the differential amplifier 12 to be the same by causing the gate capacitance of the n-MOSFET 42 inside the positive buffer and the gate capacitance of the n-MOSFET 44 inside the negative buffer to be the same.

Figure 5:
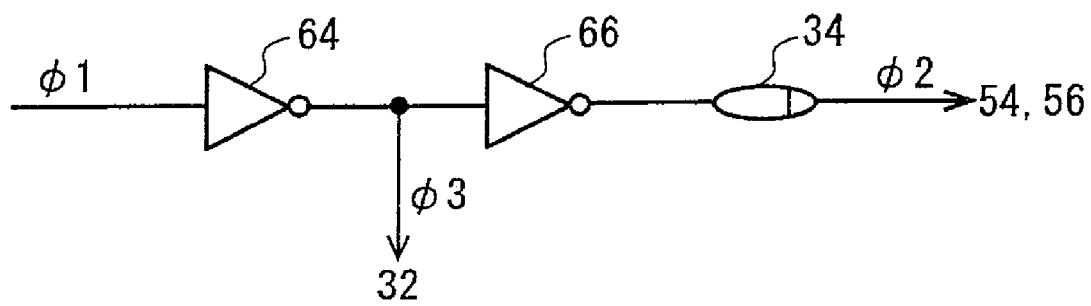
FIG. 5 shows a first example of a configuration of a timing control section 30.
Figure 6:
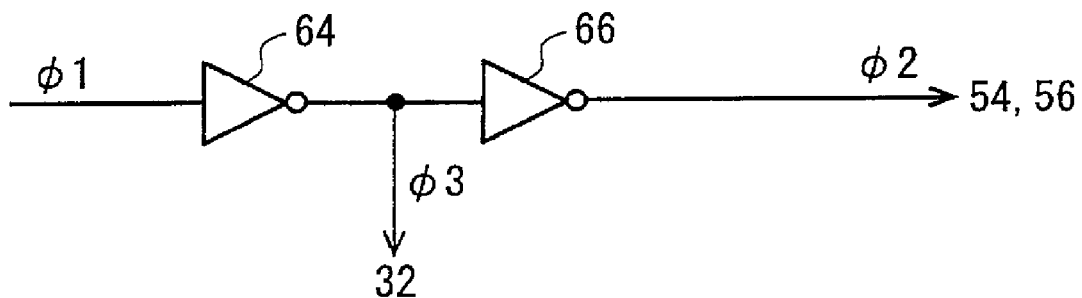
FIG. 6 shows a second example of a configuration of the timing control section 30.

FIG. 5 shows a first example of a configuration of the timing control section 30. FIG. 6 shows a second example of a configuration of the timing control section 30. As shown in FIG. 5, the timing control section 30 may include a front inverting circuit 64, a rear inverting circuit 66, and a delay element 34, for example.

The front inverting circuit 64 outputs the switch signal $\phi 3$ obtained by inverting the latch control signal $\phi 1$. The rear inverting circuit 66 again inverts the switch signal $\phi 3$. The delay element 34 outputs the delay signal $\phi 2$ obtained by delaying the output signal of the rear inverting circuit 66 by a very small amount of time. The timing control section 30 described above can generate the delay signal $\phi 2$ and the switch signal $\phi 3$ based on the latch control signal $\phi 1$.

Furthermore, in a case where the rear inverting circuit 66 outputs the inverted signal having the very short time, the timing control section 30 may have a configuration that does not include the delay element 34, as shown in FIG. 6. In such a structure as well, the timing control section 30 can generate the delay signal $\phi 2$ and the switch signal $\phi 3$ based on the latch control signal $\phi 1$.

Figure 7:
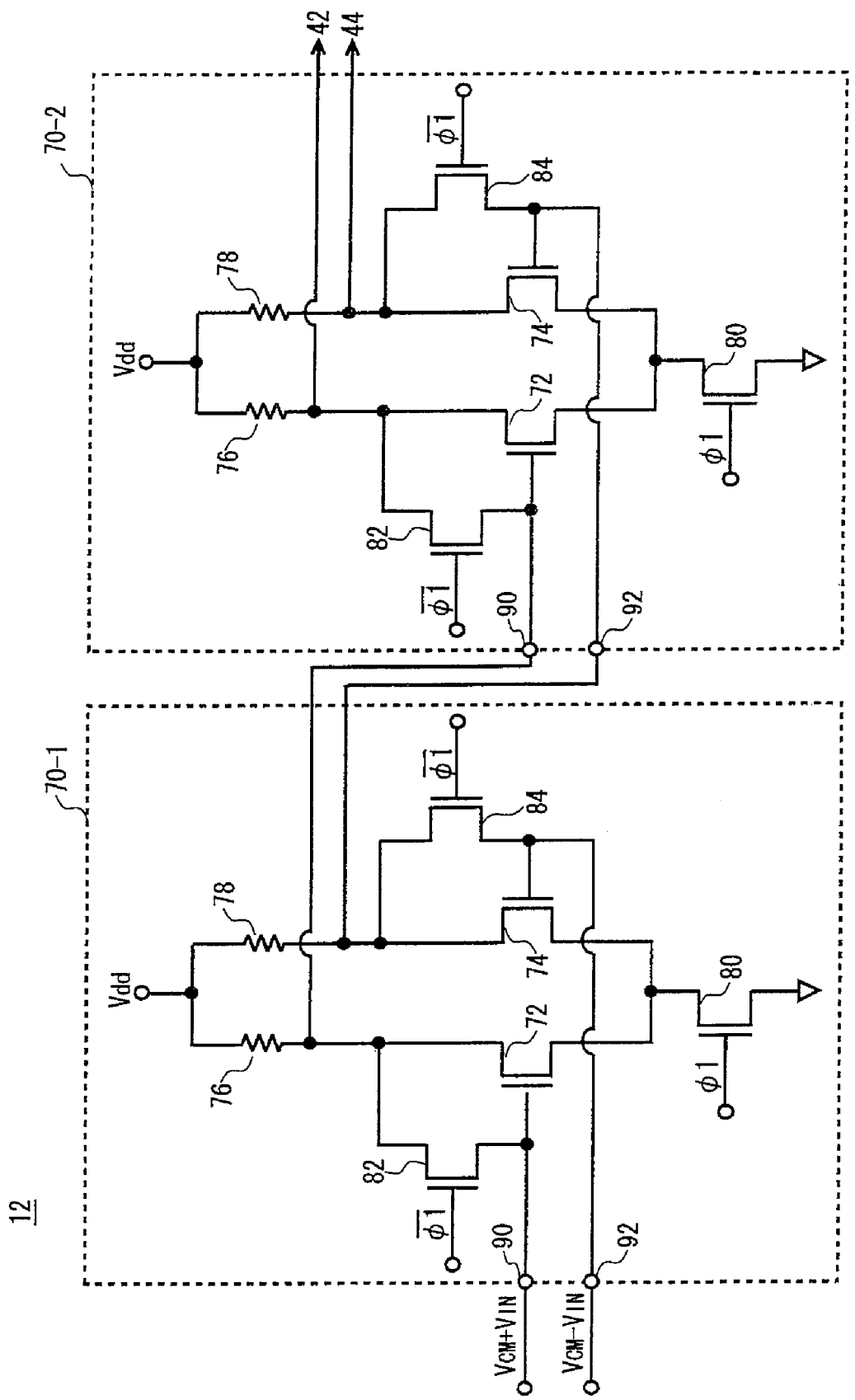
FIG. 7 shows an exemplary configuration of a differential amplification circuit that includes a differential amplifier 12.

FIG. 7 shows an exemplary configuration of a differential amplification circuit that includes the differential amplifier 12. The differential amplifier 12 may include, for example, a plurality of stages of differential amplification sections 70 (70-1, 70-2) that are connected serially and differentially amplify the positive comparison signal $(V_{CM}+V_{IN})$ and the negative comparison signal $(V_{CM}-V_{IN})$.

The differential amplification section 70 includes a positive amplification circuit 72, a negative amplification circuit 74, a positive bias resistance 76, a negative bias resistance 78, a bias switch 80, a positive input reset switch 82, and a positive input reset switch 84. The positive amplification circuit 72 receives the positive comparison signal $(V_{CM}+V_{IN})$ from the front circuit via the positive input terminal 90. The positive amplification circuit 72 then outputs the amplified positive comparison signal $(V_{CM}+AV_{IN})$ to the rear circuit. The negative amplification circuit 74 receives the negative comparison signal $(V_{CM}-V_{IN})$ from the front circuit via the negative input terminal 92. The negative amplification circuit 74 then outputs the amplified negative comparison signal $(V_{CM}-AV_{IN})$ to the rear circuit.

The positive bias resistance 76 supplies a bias voltage to the positive amplification circuit 72. The negative bias resistance 78 supplies a bias voltage to the negative amplification circuit 74.

The latch control signal $\phi 1$ is provided to the bias switch 80. In a case where the latch control signal $\phi 1$ is logic H, the bias switch 80 supplies the bias voltage to the positive amplification circuit 72 and the bias switch 80, thereby causing the positive amplification circuit 72 and the negative amplification circuit 74 to operate. Furthermore, in a case where the latch control signal φ1 is logic L, the bias switch 80 stops the supply of bias voltage to the positive amplification circuit 72 and the negative amplification circuit 74, thereby stopping operation of the positive amplification circuit 72 and the negative amplification circuit 74. Therefore, in the reset condition, the differential amplification section 70 can stop the amplification operation.

The inverted signal of the latch control signal φ1 is supplied to the positive input reset switch 82 and the positive input reset switch 84. In a case where the inverted signal of the latch control signal φ1 is logic H, the positive input reset switch 82 fixes the positive input terminal 90 at the bias voltage. In a case where the inverted signal of the latch control signal φ1 is logic L, the positive input reset switch 82 opens the positive input terminal 90.

Furthermore, in a case where the inverted signal of the latch control signal φ1 is logic H, the positive input reset switch 84 fixes the negative input terminal 92 at the bias voltage. In a case where the inverted signal of the latch control signal φ1 is logic L, the positive input reset switch 84 opens the negative input terminal 92. The positive input reset switch 82 and the positive input reset switch 84 described above can set the positive and negative input voltages to be fixed values in the reset condition.

Figure 8:
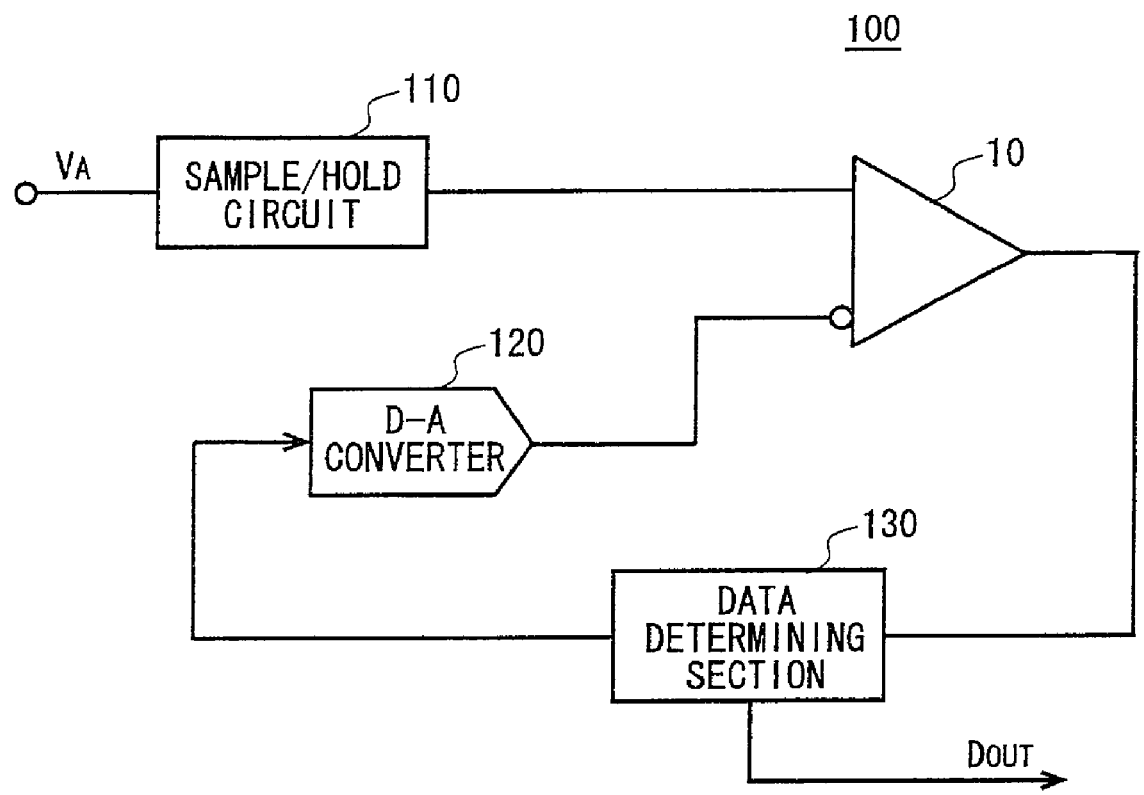
FIG. 8 shows a configuration of the A-D converter 100 according to the present embodiment.

FIG. 8 shows a configuration of an A-D converter 100 according to the present embodiment. The A-D conversion apparatus 100 outputs digital output data $D_{OUT}$ according to an analog input signal.

The A-D conversion apparatus 100 is provided with a sample/hold circuit 110, a D-A converter 120, the comparator 10, and a data determining section 130. The sample/hold circuit 110 samples a voltage value $V_A$ of an input signal using a capacitor and holds the sampled voltage value $V_A$ for a certain period of time.

The D-A converter 120 outputs a voltage value comparison signal according to digital comparison data provided from the data determining section 130. The D-A converter 120 can output a comparison signal that indicates a threshold value for quantizing the analog values into digital values.

The comparator 10 outputs a result obtained by comparing the voltage value $V_A$ of the input signal to the voltage value of the comparison signal output by the D-A converter 120. Here, because the comparator 10 has a function and structure identical to those of the comparator 10 according to the embodiment described in FIGS. 2 to 7, a detailed description is omitted.

The data determining section 130 supplies the comparison data to the D-A converter 120. The data determining section 130 then changes the comparison data and detects comparison data in which the voltage value of the input signal is the same as the voltage value of the comparison signal based on the comparison results by the comparator 10 of each value of the changed comparison data. For example, the data determining section 130 may sequentially change the comparison data according to a successive approximation process and detect comparison data in which the voltage value of the input signal is the same as the voltage value of the comparison signal.

The data determining section 130 may detect as the comparison data in which the voltage value of the input signal is the same as the voltage value of the comparison signal comparison data in which a maximum voltage value that is less than or equal to the voltage value of the input signal is generated or comparison data in which a minimum voltage value that is greater than or equal to the voltage value of the input signal is generated. The data determining section 130 described above may then output the detected comparison data as the output data $D_{OUT}$.

In the manner described above, the A-D conversion apparatus 100 can convert the voltage value $V_A$ of the analog input signal into the digital output data $D_{OUT}$. In addition, the A-D conversion apparatus 100 can convert the analog voltage signal into a digital data string by repeating the conversion for every sampling period. Here, the comparator 10 may be provided with a flash A-D converter 100 instead of the successive approximation A-D conversion apparatus 100 described above.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A comparator that outputs a comparison result obtained by comparing two signals, comprising:
    a positive buffer that converts a positive comparison signal, which has a level according to a difference between the two signals, into a positive logic signal that indicates a logic level;
    a negative buffer that converts a negative comparison signal, which has a level that is inverted in relation to the positive comparison signal, into a negative logic signal that indicates a logic level that is inverted in relation to the positive logic signal;
    a latch core that, at a timing at which a latch period in which the comparison result is held begins, acquires the logic level of the positive logic signal and the logic level of the negative logic signal and holds the acquired logic levels; and
    a potential control section that, prior to a timing at which the latch period ends, sets an output end of the positive buffer to have a potential that is identical to that of an output end of the negative buffer.

2. The comparator according to claim 1, wherein the potential control section includes a switch that, prior to the timing at which the latch period ends, provides conduction between the output end of the positive buffer and the output end of the negative buffer.

3. The comparator according to claim 1, further comprising a delay section that outputs a delay signal obtained by delaying an input latch control signal, wherein
    the potential control section, at a timing at which the latch control signal ends, sets the output end of the positive buffer to have a potential that is identical to that of the output end of the negative buffer, and
    the latch core, at a timing at which the delay signal ends, is reset to a prescribed logic level.

4. The comparator according to claim 1, further comprising a differential amplifier that differentially amplifies the positive comparison signal and the negative comparison signal and supplies the thus amplified signals to the positive buffer and the negative buffer.

5. An A-D converter that outputs digital output data according to an analog input signal, comprising:
    a comparator that outputs a comparison result obtained by comparing the input signal to a comparison signal that indicates a threshold value for quantizing an analog value into a digital value; and a data determining section that determines the output data based on the comparison result of the comparator, wherein the comparator includes a positive buffer that converts a positive comparison signal, which has a level according to a difference between the comparison signal and the input signal, into a positive logic signal that indicates a logic level, a negative buffer that converts a negative comparison signal, which has a level that is inverted in relation to the positive comparison signal, into a negative logic signal that indicates a logic level that is inverted in relation to the positive logic signal, a latch core that, at a timing at which a latch period in which the comparison result is held begins, acquires the logic level of the positive logic signal and the logic level of the negative logic signal and holds the acquired logic levels, and a potential control section that, prior to a timing at which the latch period ends, sets an output end of the positive buffer to have a potential that is identical to that of an output end of the negative buffer.

* * * * *